United States Patent
Coeck et al.

(10) Patent No.: US 9,993,976 B2
(45) Date of Patent: Jun. 12, 2018

(54) SYSTEM AND METHOD FOR CALIBRATING A LASER SCANNING SYSTEM

(71) Applicant: MATERIALISE NV, Leuven (BE)

(72) Inventors: Sam Coeck, Boutersem (BE); Kurt Renap, Herenthout (BE)

(73) Assignee: Materialise NV, Leuven (BE)

( * ) Notice: Subject to any disclaimer, the term of this patent is extended or adjusted under 35 U.S.C. 154(b) by 698 days.

(21) Appl. No.: 14/490,954

(22) Filed: Sep. 19, 2014

(65) Prior Publication Data

US 2015/0100149 A1  Apr. 9, 2015

Related U.S. Application Data

(60) Provisional application No. 61/880,125, filed on Sep. 19, 2013.

(30) Foreign Application Priority Data

Oct. 10, 2013 (GB) .................... 1317974.2

(51) Int. Cl.
  *B33Y 50/00* (2015.01)
  *B33Y 30/00* (2015.01)
  (Continued)

(52) U.S. Cl.
  CPC ........ *B29C 67/0088* (2013.01); *B29C 64/135* (2017.08); *B29C 64/386* (2017.08);
  (Continued)

(58) Field of Classification Search
  CPC ........ B32B 15/092; B33Y 30/00; B33Y 50/00
  See application file for complete search history.

(56) References Cited

U.S. PATENT DOCUMENTS

| | | | | |
|---|---|---|---|---|
| 4,863,538 A | * | 9/1989 | Deckard | B33Y 10/00 156/272.8 |
| 5,499,097 A | * | 3/1996 | Ortyn | G02B 21/26 356/401 |

(Continued)

FOREIGN PATENT DOCUMENTS

| | | |
|---|---|---|
| DE | 102004043075 A1 | 4/2005 |
| JP | 2002103459 A | 4/2002 |

(Continued)

OTHER PUBLICATIONS

International Search Report dated Dec. 22, 2014 cited in related PCT Application PCT/EP2014/070042 filed Sep. 19, 2014.

*Primary Examiner* — Ponnoreay Pich
(74) *Attorney, Agent, or Firm* — Patterson & Sheridan LLP

(57) ABSTRACT

A system and method for calibrating a laser scanning system is provided. Various embodiments involve the use of a calibration plate with reference markings which is positioned to receive a directed beam in a set of known laser scanner positions. The directed beam forms a laser spot on the calibration plate, and the laser spot is captured using an image acquisition assembly such as a digital camera along with a motorized mount. The movement of the image acquisition assembly may be coordinated with the movement of the laser scanner to track the laser spot across the plate. After photographing various positions, actual laser spot coordinates are deduced from their position relative to the known positions of the reference markings.

22 Claims, 16 Drawing Sheets

(51) Int. Cl.
  *B32B 15/092* (2006.01)
  *B29C 67/00* (2017.01)
  *G01S 5/16* (2006.01)
  *B33Y 50/02* (2015.01)
  *G05B 15/02* (2006.01)
  *G06F 17/50* (2006.01)
  *G01S 7/497* (2006.01)
  *B29C 64/135* (2017.01)
  *B29C 64/386* (2017.01)
  *B29C 64/153* (2017.01)

(52) U.S. Cl.
  CPC ............... *B33Y 50/02* (2014.12); *G01S 5/16* (2013.01); *G01S 7/4972* (2013.01); *G05B 15/02* (2013.01); *G06F 17/50* (2013.01); *B29C 64/153* (2017.08)

(56) References Cited

U.S. PATENT DOCUMENTS

| | | | | |
|---|---|---|---|---|
| 5,768,443 | A * | 6/1998 | Michael | G06T 7/85 382/151 |
| 5,832,415 | A * | 11/1998 | Wilkening | B29C 67/0088 702/86 |
| 6,615,099 | B1 | 9/2003 | Mueller | |
| 7,689,001 | B2 | 3/2010 | Kim | |
| 2003/0105538 | A1 * | 6/2003 | Wooten | G05B 19/4099 700/90 |
| 2006/0022379 | A1 * | 2/2006 | Wicker | B33Y 30/00 264/255 |
| 2008/0217818 | A1 * | 9/2008 | Holmboe | B29C 67/0066 264/401 |
| 2009/0060386 | A1 * | 3/2009 | Cooper | B23K 33/00 382/294 |
| 2010/0125356 | A1 * | 5/2010 | Shkolnik | G06T 1/00 700/98 |
| 2010/0264302 | A1 * | 10/2010 | Philippi | B23K 26/046 250/252.1 |
| 2013/0186871 | A1 * | 7/2013 | Suzuki | B23K 26/04 219/121.77 |
| 2013/0297320 | A1 * | 11/2013 | Buser | B29C 67/0055 704/275 |
| 2013/0328227 | A1 * | 12/2013 | McKinnon | B29C 67/0088 264/40.1 |
| 2014/0156053 | A1 * | 6/2014 | Mahdavi | B29C 67/0059 700/119 |

FOREIGN PATENT DOCUMENTS

| | | |
|---|---|---|
| WO | 2009026520 A1 | 2/2009 |
| WO | 2009054442 A1 | 4/2009 |

* cited by examiner

FIG. 8

| EXPECTED X | EXPECTED Y | MEASURED X | MEASURED Y |
|---|---|---|---|
| -120 | -120 | -118,752 | -119,799 |
| -120 | -100 | -118,776 | -998,517 |
| -120 | -80 | -118,775 | -798,909 |
| -120 | -60 | -118,779 | -599,129 |
| -120 | -40 | -118,784 | -399,404 |
| -120 | -20 | -118,791 | -200,508 |
| -120 | 0 | -118,769 | -0,18275 |
| -120 | 20 | -118,791 | 1,966,464 |
| -120 | 40 | -118,774 | 394,651 |
| -120 | 60 | -118,767 | 5,924,555 |
| -120 | 80 | -118,757 | 7,897,979 |
| -120 | 100 | -118,731 | 9,869,787 |
| -120 | 120 | -118,752 | 1,183,879 |
| -100 | -120 | -989,908 | -119,778 |
| -100 | -100 | -989,923 | -998,085 |
| -100 | -80 | -990,085 | -798,515 |
| -100 | -60 | -990,204 | -598,655 |
| -100 | -40 | -990,188 | -398,981 |
| -100 | -20 | -99,033 | -199,965 |
| -100 | 0 | -990,313 | -0,12303 |
| -100 | 20 | -990,169 | 1,972,003 |
| -100 | 40 | -990,309 | 3,953,363 |
| -100 | 60 | -990,205 | 5,931,008 |
| -100 | 80 | -990,018 | 7,903,295 |
| -100 | 100 | -989,929 | 98,785 |
| -100 | 120 | -98,966 | 1,184,771 |
| -80 | -120 | -792,038 | -119,762 |
| -80 | -100 | -792,388 | -99,769 |
| -80 | -80 | -792,379 | -798,173 |
| -80 | -60 | -792,414 | -598,371 |
| -80 | -40 | -79,248 | -398,705 |
| -80 | -20 | -79,267 | -199,619 |
| -80 | 0 | -792,666 | -0,08266 |
| -80 | 20 | -792,583 | 1,975,759 |
| -80 | 40 | -792,523 | 3,957,263 |
| -80 | 60 | -792,544 | 5,936,986 |
| -80 | 80 | -792,387 | 7,910,612 |
| -80 | 100 | -792,274 | 9,882,817 |
| -80 | 120 | -792,142 | 1,185,202 |
| -60 | -120 | -593,958 | -119,745 |
| -60 | -100 | -594,123 | -997,771 |
| -60 | -80 | -594,303 | -798,119 |
| -60 | -60 | -594,422 | -598,293 |
| -60 | -40 | -594,624 | -398,395 |
| -60 | -20 | -59,547 | -199,386 |
| -60 | 0 | -594,672 | -0,05482 |
| -60 | 20 | -594,715 | 198,046 |
| -60 | 40 | -594,666 | 3,961,464 |
| -60 | 60 | -594,602 | 5,941,548 |
| -60 | 80 | -594,472 | 7,916,334 |
| -60 | 100 | -594,512 | 9,886,936 |
| -60 | 120 | -594,375 | 1,185,874 |

SYSTEM AND METHOD FOR CALIBRATING A LASER SCANNING SYSTEM

PRIORITY CLAIM

This application claim priority under 35 U.S.C. § 119(a) to Great Britain Patent Application GB 1317974.2, filed on Oct. 10, 2013, and under 35 U.S.C. § 119(e) to U.S. Provisional Patent Application No. 61/880,125, filed on Sep. 19, 2013, each of which is hereby incorporated by reference in its entirety.

BACKGROUND OF THE INVENTION

Field of the Invention

This application relates to the calibration of laser scanning systems. More particularly, this application relates to a system and method for calibrating a laser scanning system using a motion-controlled camera and a reference calibration plate.

Description of the Related Technology

Laser scanning systems are used in many different applications. One of these applications is the field of additive manufacturing, in which three dimensional solid objects are formed from a digital model. Because the manufactured objects are three dimensional, additive manufacturing is commonly referred to as three dimensional ("3D") printing. The use of laser scanning systems in additive manufacturing is especially prevalent in stereolithography and selective laser sintering ("SLS") manufacturing techniques. These techniques use laser scanning systems to direct a laser beam to a specified location in order to polymerize or solidify layers of build materials which are used to create the desired three dimensional ("3D") object.

The laser scanning systems used in connection with additive manufacturing should provide a very high degree of precision. This high degree of precision helps to ensure that the manufactured object is consistent with the digital model. However, in order to maintain this precision over time, laser scanning systems must be calibrated for various reasons. In some instances, the calibration is necessary due to variations in the laser beam which develop with use of the device. In other instances, temperature fluctuations may impact the accuracy of the laser scanning system.

Existing techniques for calibrating laser scanning systems are both expensive and complex. They often involve expensive, limited-use parts which must be made specifically for the machine to be calibrated. Other techniques call for the use of complex sensor systems which also add both cost and complexity to any calibration process. In view of these and other problems identified by the inventors, a need for fast, accurate, and automated techniques for calibrating laser scanning systems is needed.

SUMMARY

In one embodiment, a system for calibrating a laser scanning system in an additive manufacturing environment is provided. The system may include a calibration plate comprising reference markings. The calibration plate may be positioned substantially parallel to a scanning area of the laser scanning system. The system further may include a laser scanner configured to send a laser beam to a predefined location on the calibration plate which forms a laser marking on the calibration plate. An image acquisition assembly comprising an image acquisition device may be provided. The image acquisition device may be configured to photograph at least a portion of the calibration plate associated with the predefined location on the calibration plate. A computer control system comprising one or more computers having a memory and a processor may also form a part of the system. The computer control system may be configured to cause the laser scanner to direct the laser beam to a plurality of predefined locations on the calibration plate thereby creating one or more laser markings. The computer control system may be further configured to receive an image of each of the proximate locations. Laser marking coordinates may be determined for each predefined location based on the position of the formed laser marking relative to the reference markings on the calibration plate, and the scanner corrections are also determined based on the determined laser marking coordinates.

In another embodiment, a method of calibrating a laser scanner in an additive manufacturing environment is provided. The method may include inserting a calibration plate into the additive manufacturing environment. The device may be positioned substantially parallel to a scanning area of the laser scanner. The method further includes forming one or more markings on the calibration plate by directing a laser beam from the laser scanner at a plurality of predefined locations. An image acquisition assembly acquires an image of each of the markings and the predefined locations. Laser marking coordinates are determined for each predefined location based on the position of the laser markings relative to at least one reference marking on the calibration plate. Scanner corrections are then determined based on the determined laser marking coordinates.

BRIEF DESCRIPTION OF THE DRAWINGS

FIG. 8 is an example of a table showing expected and measured laser marking coordinates.

DETAILED DESCRIPTION OF CERTAIN INVENTIVE EMBODIMENTS

Systems and methods disclosed herein provide a simple, inexpensive way to calibrate laser scanning systems used in connection with 3D printing applications. A calibration plate with reference markings may be used to receive laser scans from the laser scanning device. An image acquisition assembly, such as a digital camera for example, may be positioned above the calibration plate, and configured to take photographic images of the markings made by the laser scans on the plate. Laser marking coordinates may then be determined for each predefined location based on the position of the formed laser marking relative to the reference markings on the calibration plate. Using these coordinates, scanner corrections may then be determined.

Figure 1:
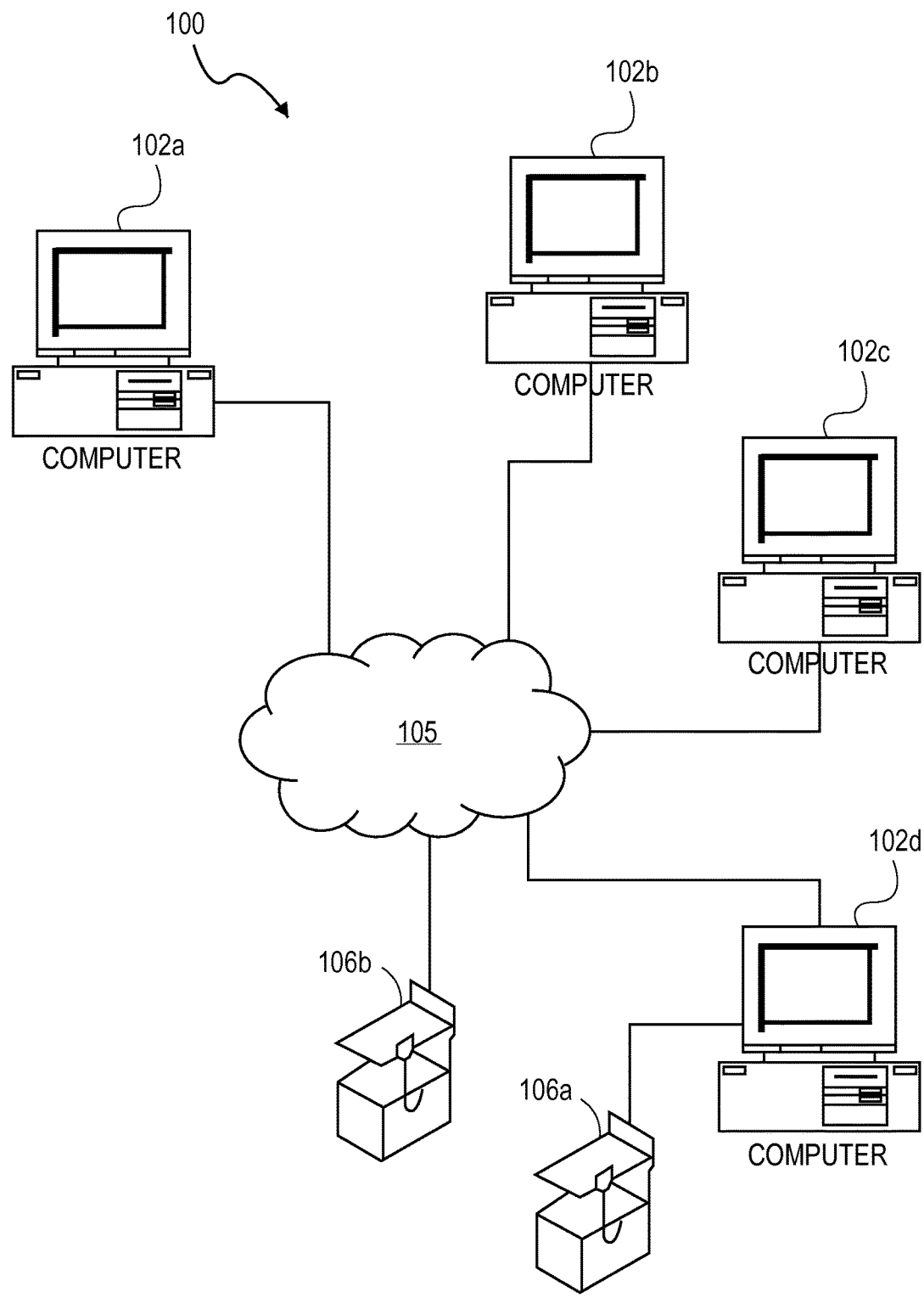
FIG. 1 is an example of a system for designing and manufacturing 3D objects.

Embodiments of the invention may be practiced within a system for designing and manufacturing 3D objects. Turning to FIG. 1, an example of a computer environment suitable for the implementation of 3D object design and manufacturing is shown. The environment includes a system 100. The system 100 includes one or more computers 102a-102d, which can be, for example, any workstation, server, or other computing device capable of processing information. In some aspects, each of the computers 102a-102d can be connected, by any suitable communications technology (e.g., an internet protocol), to a network 105 (e.g., the Internet). Accordingly, the computers 102a-102d may transmit and receive information (e.g., software, digital representations of 3-D objects, commands or instructions to operate an additive manufacturing device, etc.) between each other via the network 105.

The system 100 further includes one or more additive manufacturing devices (e.g., 3-D printers) 106a-106b. As shown the additive manufacturing device 106a is directly connected to a computer 102d (and through computer 102d connected to computers 102a-102c via the network 105) and additive manufacturing device 106b is connected to the computers 102a-102d via the network 105. Accordingly, one of skill in the art will understand that an additive manufacturing device 106 may be directly connected to a computer 102, connected to a computer 102 via a network 105, and/or connected to a computer 102 via another computer 102 and the network 105.

It should be noted that though the system 100 is described with respect to a network and one or more computers, the techniques described herein also apply to a single computer 102, which may be directly connected to an additive manufacturing device 106.

Figure 2:
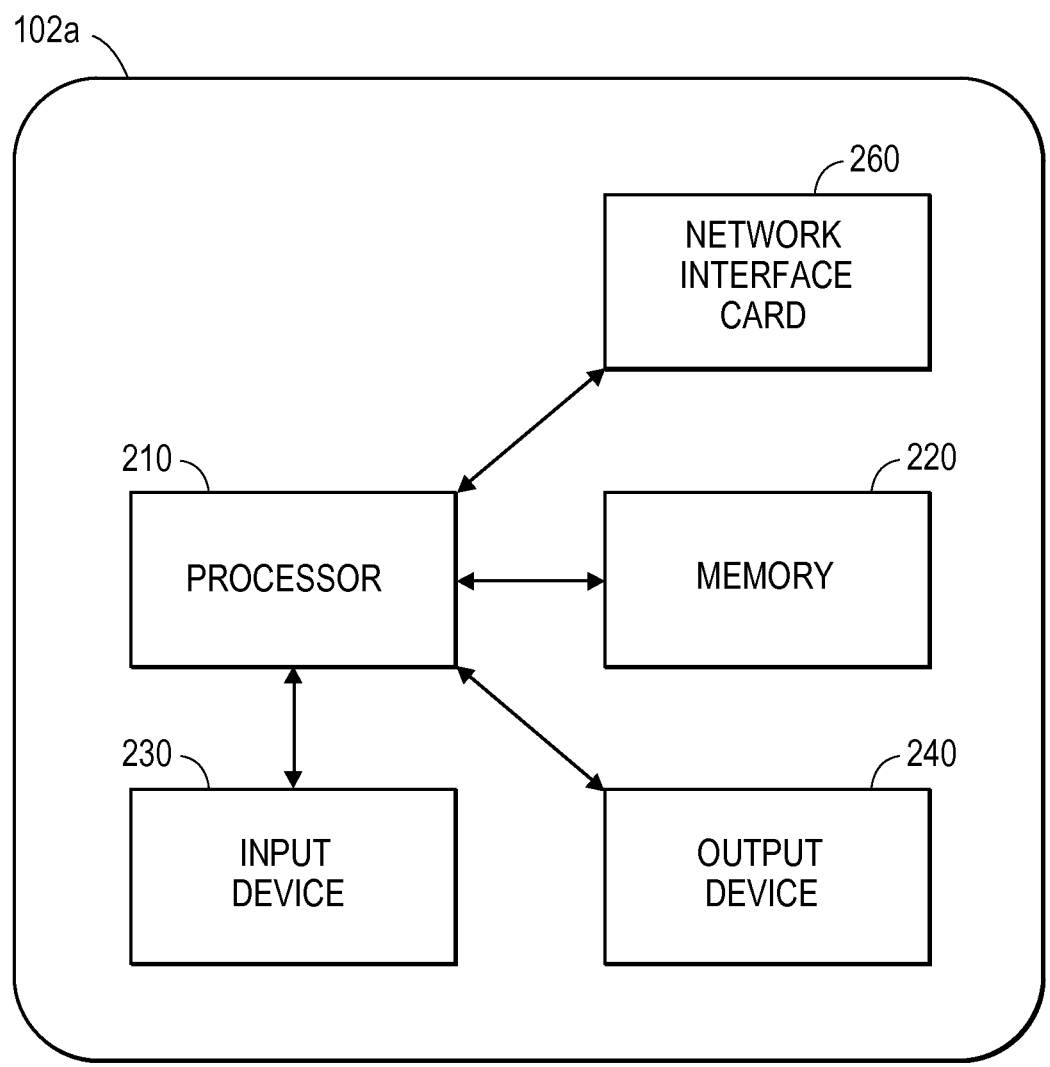
FIG. 2 illustrates a functional block diagram of one example of the computer shown in FIG. 1.

FIG. 2 illustrates a functional block diagram of one example of a computer of FIG. 1. The computer 102a includes a processor 210 in data communication with a memory 220, an input device 230, and an output device 240. In some embodiments, the processor is further in data communication with an optional network interface card 260. Although described separately, it is to be appreciated that functional blocks described with respect to the computer 102a need not be separate structural elements. For example, the processor 210 and memory 220 may be embodied in a single chip.

The processor 210 can be a general purpose processor, a digital signal processor (DSP), an application specific integrated circuit (ASIC), a field programmable gate array (FPGA) or other programmable logic device, discrete gate or transistor logic, discrete hardware components, or any suitable combination thereof designed to perform the functions described herein. A processor may also be implemented as a combination of computing devices, e.g., a combination of a DSP and a microprocessor, a plurality of microprocessors, one or more microprocessors in conjunction with a DSP core, or any other such configuration.

The processor 210 can be coupled, via one or more buses, to read information from or write information to memory 220. The processor may additionally, or in the alternative, contain memory, such as processor registers. The memory 220 can include processor cache, including a multi-level hierarchical cache in which different levels have different capacities and access speeds. The memory 220 can also include random access memory (RAM), other volatile storage devices, or non-volatile storage devices. The storage can include hard drives, optical discs, such as compact discs (CDs) or digital video discs (DVDs), flash memory, floppy discs, magnetic tape, and Zip drives.

The processor 210 also may be coupled to an input device 230 and an output device 240 for, respectively, receiving input from and providing output to a user of the computer 102a. Suitable input devices include, but are not limited to, a keyboard, buttons, keys, switches, a pointing device, a mouse, a joystick, a remote control, an infrared detector, a bar code reader, a scanner, a video camera (possibly coupled with video processing software to, e.g., detect hand gestures or facial gestures), a motion detector, or a microphone (possibly coupled to audio processing software to, e.g., detect voice commands). Suitable output devices include, but are not limited to, visual output devices, including displays and printers, audio output devices, including speakers, headphones, earphones, and alarms, additive manufacturing devices, and haptic output devices.

The processor 210 further may be coupled to a network interface card 260. The network interface card 260 prepares data generated by the processor 210 for transmission via a network according to one or more data transmission protocols. The network interface card 260 also decodes data received via a network according to one or more data transmission protocols. The network interface card 260 can include a transmitter, receiver, or both. In other embodiments, the transmitter and receiver can be two separate components. The network interface card 260, can be embodied as a general purpose processor, a digital signal processor (DSP), an application specific integrated circuit (ASIC), a field programmable gate array (FPGA) or other programmable logic device, discrete gate or transistor logic, discrete hardware components, or any suitable combination thereof designed to perform the functions described herein.

Figure 3:
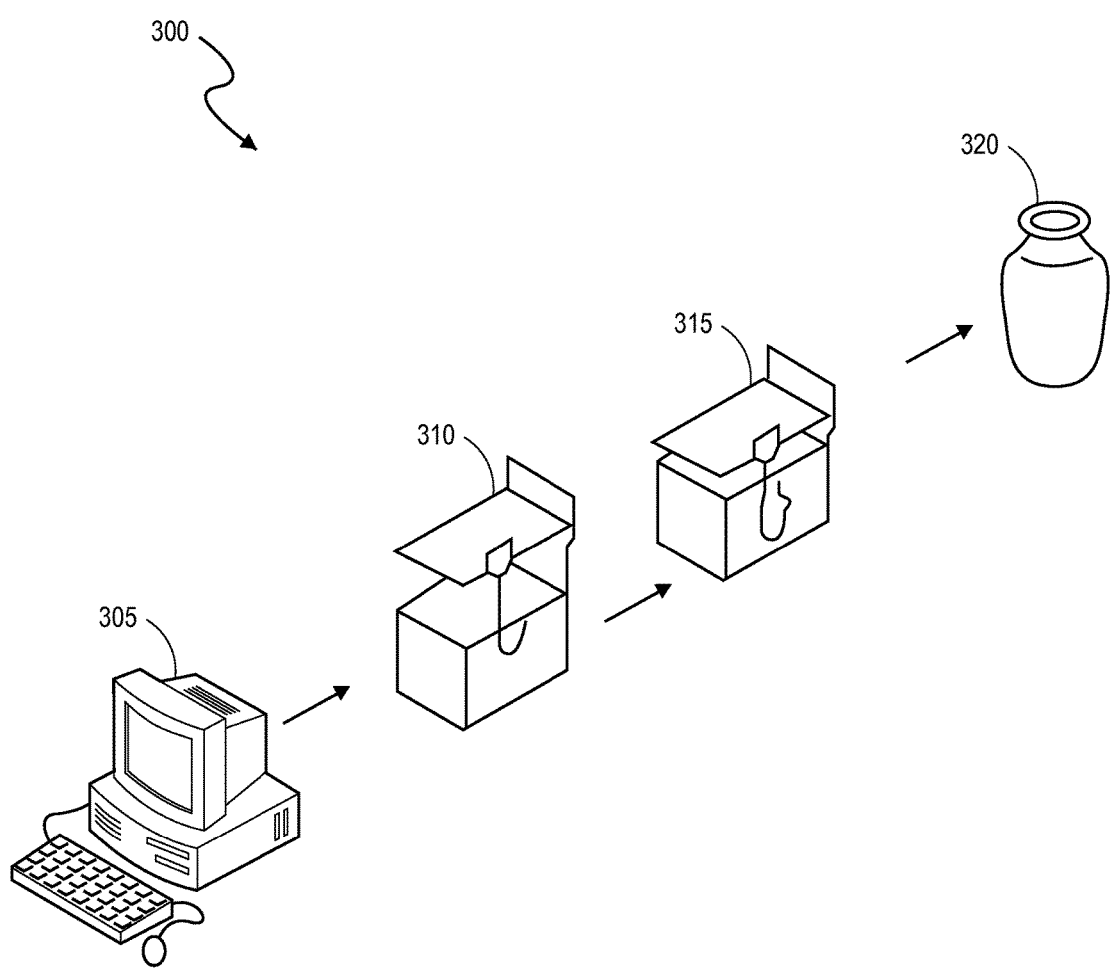
FIG. 3 shows a high level process for manufacturing a 3D object using.

FIG. 3 illustrates a process 300 for manufacturing a 3-D object or device. As shown, at a step 305, a digital representation of the object is designed using a computer, such as the computer 102a. For example, 2-D or 3-D data may be input to the computer 102a for aiding in designing the digital representation of the 3-D object. Continuing at a step 310, information is sent from the computer 102a to an additive manufacturing device, such as additive manufacturing device 106, and the device 106 commences the manufacturing process in accordance with the received information. At a step 315, the additive manufacturing device 106 continues manufacturing the 3-D object using suitable materials, such as a liquid resin.

These suitable materials may include, but are not limited to a photopolymer resin, polyurethane, methyl methacrylateacrylonitrile-butadiene-styrene copolymer, resorbable materials such as polymer-ceramic composites, etc. Examples of commercially available materials are: DSM Somos® series of materials 7100, 8100, 9100, 9420, 10100, 11100, 12110, 14120 and 15100 from DSM Somos; ABSplus-P430, ABSi, ABS-ESDI, ABS-M30, ABS-M30i, PC-ABS, PC ISO, PC, ULTEM 9085, PPSF and PPSU materials from Stratasys; Accura Plastic, DuraForm, CastForm, Laserform and VisiJet line of materials from 3-Systems; the PA line of materials, PrimeCast and PrimePart materials and Alumide and CarbonMide from EOS GmbH. The VisiJet line of materials from 3-Systems may include Visijet Flex, Visijet Tough, Visijet Clear, Visijet HiTemp, Visijet e-stone, Visijet Black, Visijet Jewel, Visijet FTI, etc. Examples of other materials may include Objet materials, such as Objet Fullcure, Objet Veroclear, Objet Digital Materials, Objet Duruswhite, Objet Tangoblack, Objet Tangoplus, Objet Tangoblackplus, etc. Another example of materials may include materials from the Renshape 5000 and 7800 series. Further, at a step 320, the 3-D object is generated.

Figure 4A:
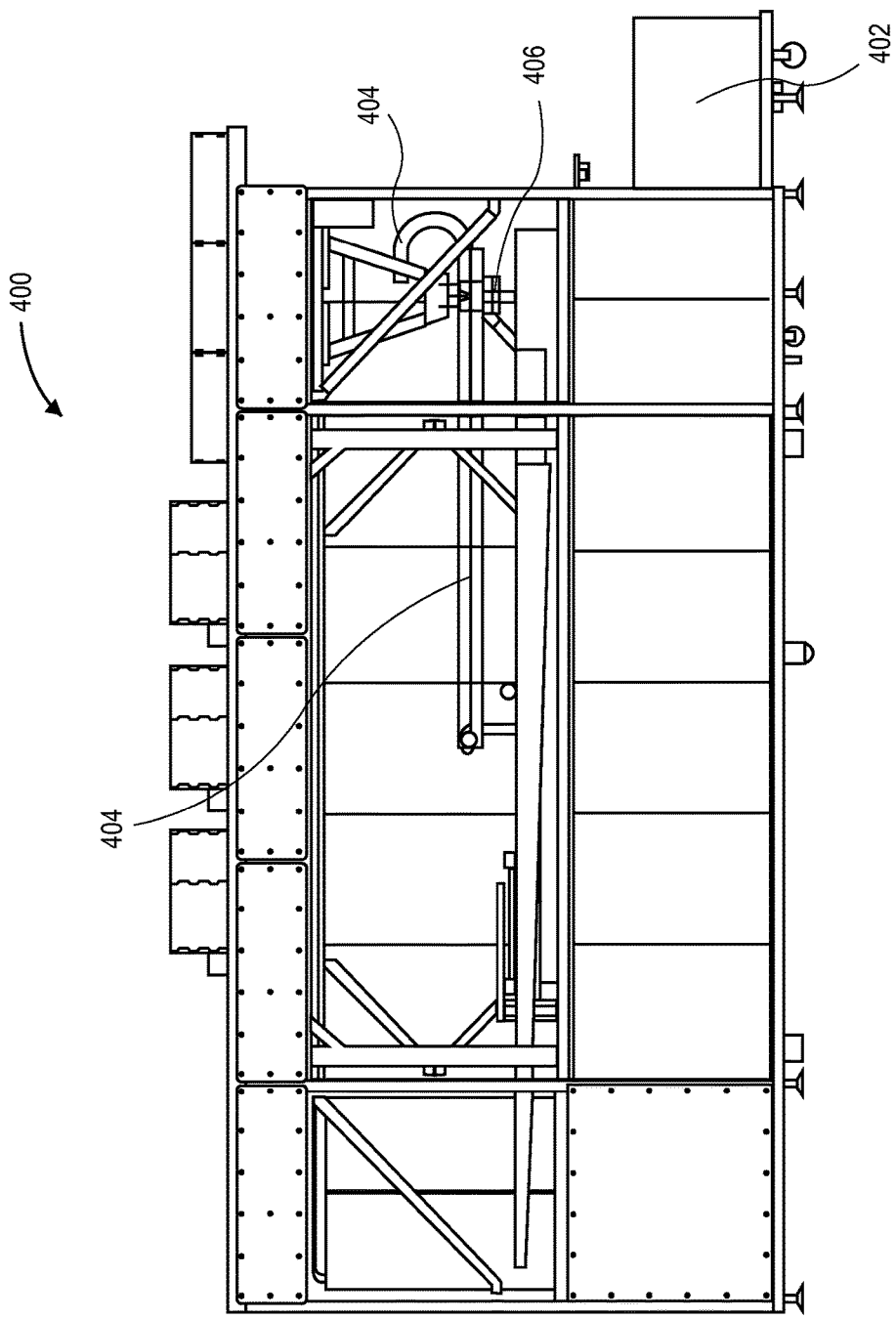
FIG. 4A is an example of a laser scanning system which may be calibrated using the systems and methods disclosed herein.

FIG. 4A illustrates an exemplary additive manufacturing apparatus 400 for generating a three-dimensional (3-D) object. In this example, the additive manufacturing apparatus 400 is a stereolithography apparatus. The stereolithography apparatus 400 includes a reservoir 402 that may hold a volume of liquid, such as a resin used to build the 3-D object. The stereolithography apparatus 400 further includes a transport system 404 that may be used to transport the liquid from the reservoir 402 to an object coater head 406. The transport system may include one or more tubes, pipes, or hoses configured to transport the liquid from the reservoir 402. In some embodiments, the transport system 404 may include metal or plastic materials, such as ultra-high molecular weight polyethylene (UHMWPE), polyacrylate (PA), polyvinyl chloride (PVC), or any other suitable material. Although this particular example provides a stereolithography apparatus with a transport system, a skilled artisan will appreciate that other types of stereolithography apparatuses may not use a transport system to transport resin to a build platform. Rather, the build platform may instead be configured to sink into the reservoir during the building process.

The stereolithography apparatus 400 may further include a guiding structure in the reservoir 402 configured to guide a flow of the liquid from the reservoir 402 to the transport system 404. For example, the structure may include a series of tubes or plates that are placed to strategically direct the flow of the liquid to the transport system 404. The apparatus 400 also may include a building area where the liquid resin is deposited. The building area typically includes a building area support upon which the 3D object is built.

The stereolithography apparatus 400 further includes a light source. The light source is typically included for the purpose of polymerizing the liquid to form a 3D object. The light source may take various forms. In some embodiments, the light source may be an electromagnetic light source, such as a ultra-violet (UV) light source, an infrared (IR) light source. In general, the light source may be any type of laser beam capable of solidifying the liquid.

In some implementations, the stereolithography apparatus 400 may include at least one pump used to pump the liquid from the reservoir 402 to the object coater head 406. For example, a positive displacement pump and/or a centrifugal-type pump may be used. In some embodiments, the pump may include a filter unit to add further filtration to the liquid resin prior to being deposited to the building area. In some aspects, the pump may provide a defined flow (e.g., 0.5-40 liters/min) that may be fixed or regulated via an active feedback loop. For example, the feedback loop may be direct based upon flow measurements. As another example, the feedback may be indirect using measurements of the thickness of the layers being deposited in the additive manufacturing process.

The stereolithography apparatus 400 may be used to generate one or more 3D objects layer by layer. The stereolithography machine 400, for example, may utilize a liquid resin (e.g., a photopolymer resin) to build an object a layer at a time, such as by depositing the resin from the object coater head 406 in the form of a curtain. In these implementations, the object coater head 406 may deposit successive layers of the liquid resin to form the object. Initially, the object coater head 406 may deposit a layer of the 3D object on the building area support. Subsequent layers may be then deposited on the preceding layer of the 3D object.

With the depositing of each layer, the light source, which as discussed above may be controlled by a computer, may trace a specific pattern on the surface of the liquid resin to form the dimensions of the 3D object. Exposure to the light source polymerizes, cures, or solidifies the pattern traced on the resin and adheres it to the layer below. After a coat has been polymerized, the building area support may descend by a single layer thickness and a subsequent layer pattern is traced and is adhered to the previous layer. The building process is complete when the 3-D object is formed by depositing all layers of the 3D object.

Figure 4B:
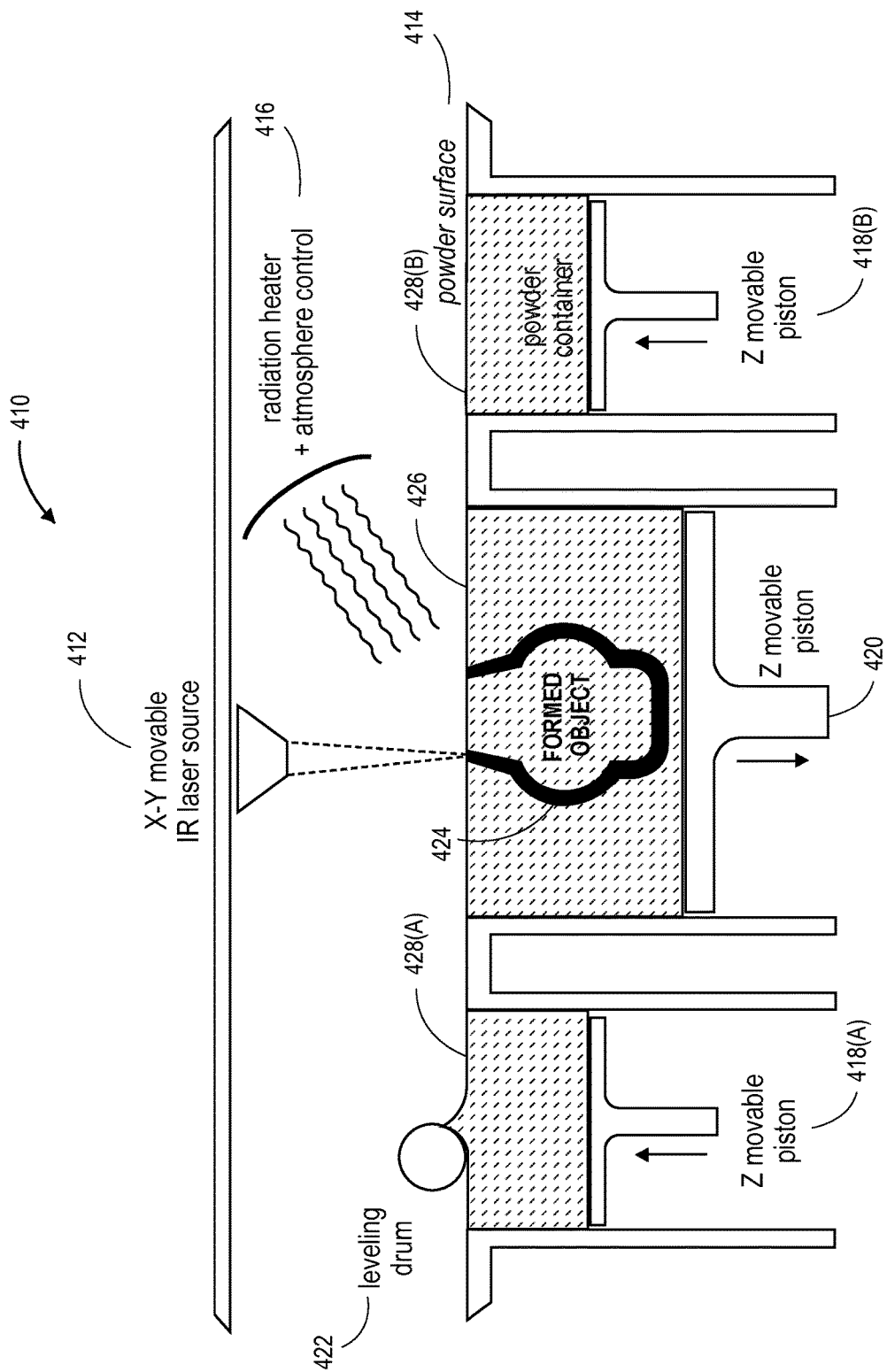
FIG. 4B is an example of another laser scanning system which may be calibrated using the systems and methods disclosed herein.

Turning now to FIG. 4B, another example of an additive manufacturing apparatus is provided. In this example, the additive manufacturing apparatus is a laser sintering device 410. Like the stereolithography device, the laser sintering device 410 allows 3D objects to be built layer by layer. The layers are formed of powder, such as the powder surface 414 shown in FIG. 4B. Successive powder layers are spread on top of each other using, for example, a leveling drum 422. After deposition, a computer-controlled CO2 laser beam scans the surface and selectively binds together the powder particles of the corresponding cross section of the product. In this example, the laser source 412 is an X-Y moveable infrared laser source. As such, the laser source can be moved along an X axis and along a Y axis in order to direct its beam to a specific location of the top most layer of powder. In some embodiments, the laser sintering device may further include a laser scanner (not shown in FIG. 4B) which receives a laser beam from a stationary laser source 412, and deflects it over moveable mirrors to direct the beam to a specified location in the working area of the device. During laser exposure, the powder temperature rises above the glass transition point after which adjacent particles flow together to create the 3D object. The device 410 may also include a radiation heater and atmosphere control device 416. The radiation heater may be used to preheat the power between the recoding of a new power later powder layer in the scanning of that layer. The atmosphere control device may be used throughout the process to avoid undesired scenarios such as, for example, powder oxidation.

In some embodiments, the powder may be distributed using one or more moveable pistons 418(a) and 418(b) which push powder from a powder container 428(a) and 428(b) into a reservoir 426 which holds the formed object 424. The depth of the reservoir, in turn, is also controlled by a moveable piston 420, which increases the depth of the reservoir 426 via downward movement as additional powder is moved from the powder containers 428(a) and 428(b) in to the reservoir 426.

Figure 4C:
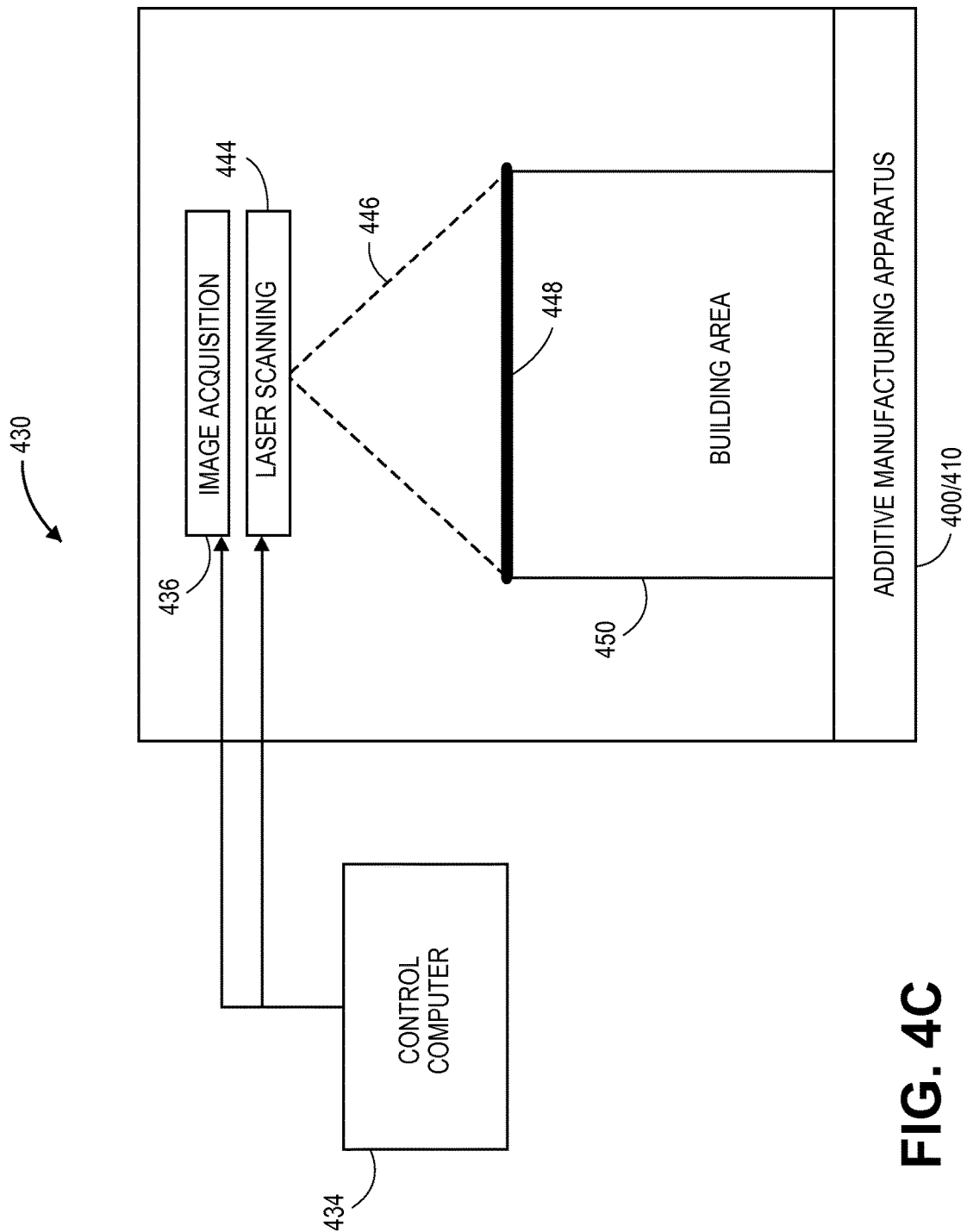
FIG. 4C is an example of components of a calibration apparatus which may be used in connection with the laser scanning system of FIG. 4A and FIG. 4B.

As discussed above, in the case of both the stereolithography apparatus 400 and the laser sintering apparatus 410, the laser scanner may require periodic calibrating in order to ensure that the structure of the prepared 3D objects is consistent with the inputted designs. FIG. 4C is a high level illustration of various components of a calibration apparatus 430 which may be used in to calibrate the laser scanner used in the additive manufacturing systems 400/410 shown in FIGS. 4A and 4B.

The calibration apparatus includes a control computer 434. The control computer 434 may be the computer 102(a) from FIG. 2 or the computer 305 from FIG. 3. Alternatively, the control computer 434 may be a separate computer that is designed to drive the calibration process. The control computer 434 may be connected to a laser scanning device 444. As discussed above, the laser scanning device may include movable mirrors which can direct the laser beam received from a laser source into the building area. The laser source may also be a movable laser source 412 such as that shown in FIG. 4B., or it may also be the laser scanner provided in the stereolithography device 400 from FIG. 4A. The control computer 434 may further include software which controls the movement and functionality of the laser scanning device 444. As such, the control computer 434 may be configured to control the moment and activation of the laser scanning device.

The control computer 434 of the calibration apparatus 430 may further be connected to an image acquisition assembly 436. The image acquisition assembly may be configured to acquire images of a calibration plate 448. More particularly, the image acquisition assembly 436 may be configured to acquire images of laser spots and/or other markings made on the calibration plate 448 by the laser scanning device 444. Additional details about the calibration plate 448 will be discussed in detail in connection with FIGS. 5A-5D below.

The calibration plate 448 may be positioned in the building area 450 of the additive manufacturing device 400/410. In some embodiments, the calibration plate may be positioned in precisely the same location as the powder surface 414 of the laser sintering device 410. In other embodiments, such as those where the laser scanning device of a stereolithography device 400 is calibrated using the calibration apparatus 430, the calibration plate 448 may be positioned in precisely the same location as the liquid resin during ordinary operation of the device. Alternatively, the calibration plate 448 may also be positioned outside of the building area 450, typically in a position closer to the laser scanning device 444. This type of configuration may provide for an easier way to insert and remove the calibration plate 448 from the additive manufacturing device 400/410, because there is no need to remove any resin and/or powder from the device.

Figure 4E:
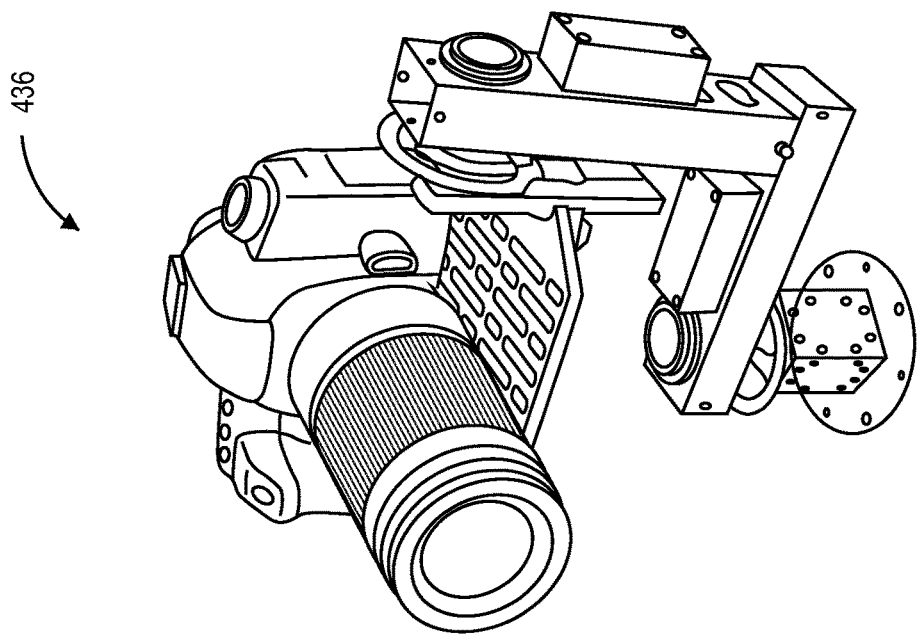
FIG. 4E is an example of an image acquisition assembly of FIG. 4C.
Figure 4D:
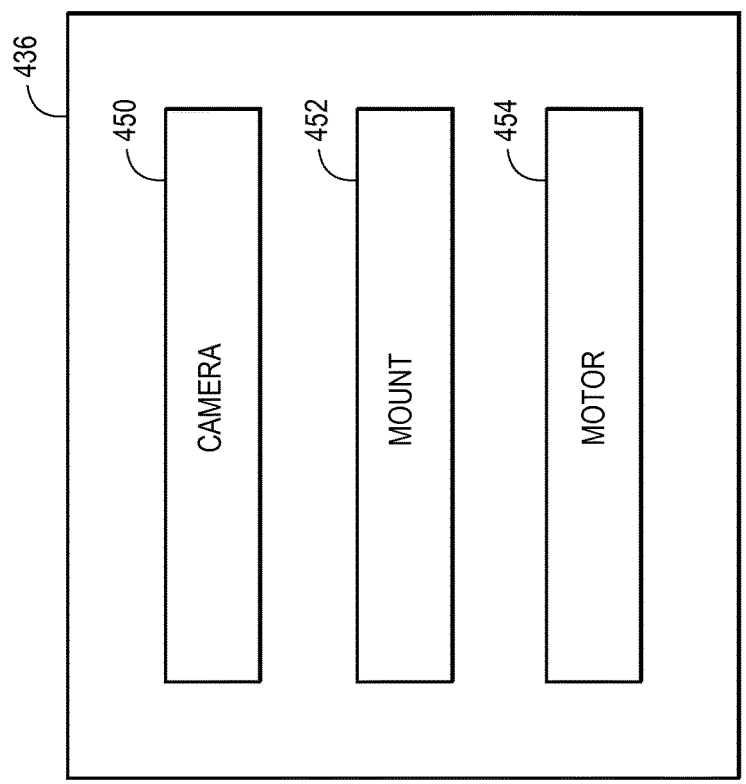
FIG. 4D is an example of a block diagram of components of an image acquisition assembly of FIG. 4C.

Turning now to FIGS. 4D and 4E, more detailed views of the image acquisition assembly are provided. FIG. 4D is a block diagram which shows various components of the image acquisition assembly 436 according to one or more embodiments. In this example, the image acquisition assembly 436 includes a camera 450. The camera 450 may be a commercial off-the-shelf ("COTS") digital camera having sufficient resolution to capture laser spots and other markings on the calibration plate 448 in sufficient detail to calibrate the laser scanning device. Alternatively, the camera may take the form of a special purpose camera which is configured to capture laser spots reflecting from the surface of the calibration plate.

In order to capture laser spots on the calibration plate, it may be necessary to position the camera 450 so that it points to the area near the laser spot created by the laser scanner 444. Accordingly, the image acquisition assembly 436 we also include a mount 452. In some embodiments, the mount may be a tilt-pan mount, which provides a range of motion sufficient to capture images in various locations on the calibration plate 448. The mount 452 may be driven by a motor 454. The motor 454 may be configured to receive control signals from the control computer 434 which provide instructions for the movement of the camera 450. In some embodiments, in addition to having a tilt-pan range of motion, the camera 450 may be further mounted on a projecting arm of a crane, commonly referred to as a jib. The jib may provide a further range of motion by allowing the camera not only to tilt and pan, but also to physically move its location in order to better acquire images of laser spots and/or markings on the calibration plate 448. FIG. 4E provides an illustration of one example of an image acquisition assembly 436. In this particular example, commercial, off-the-shelf components are used. The image acquisition assembly 436 may be mounted on the additive manufacturing device 400/410. It may be mounted either temporarily for the purposes of calibrating the laser scanning device 444, or it may be mounted permanently, so that calibration may be performed without the need for extensive modification and retooling of the device.

Figure 5A:
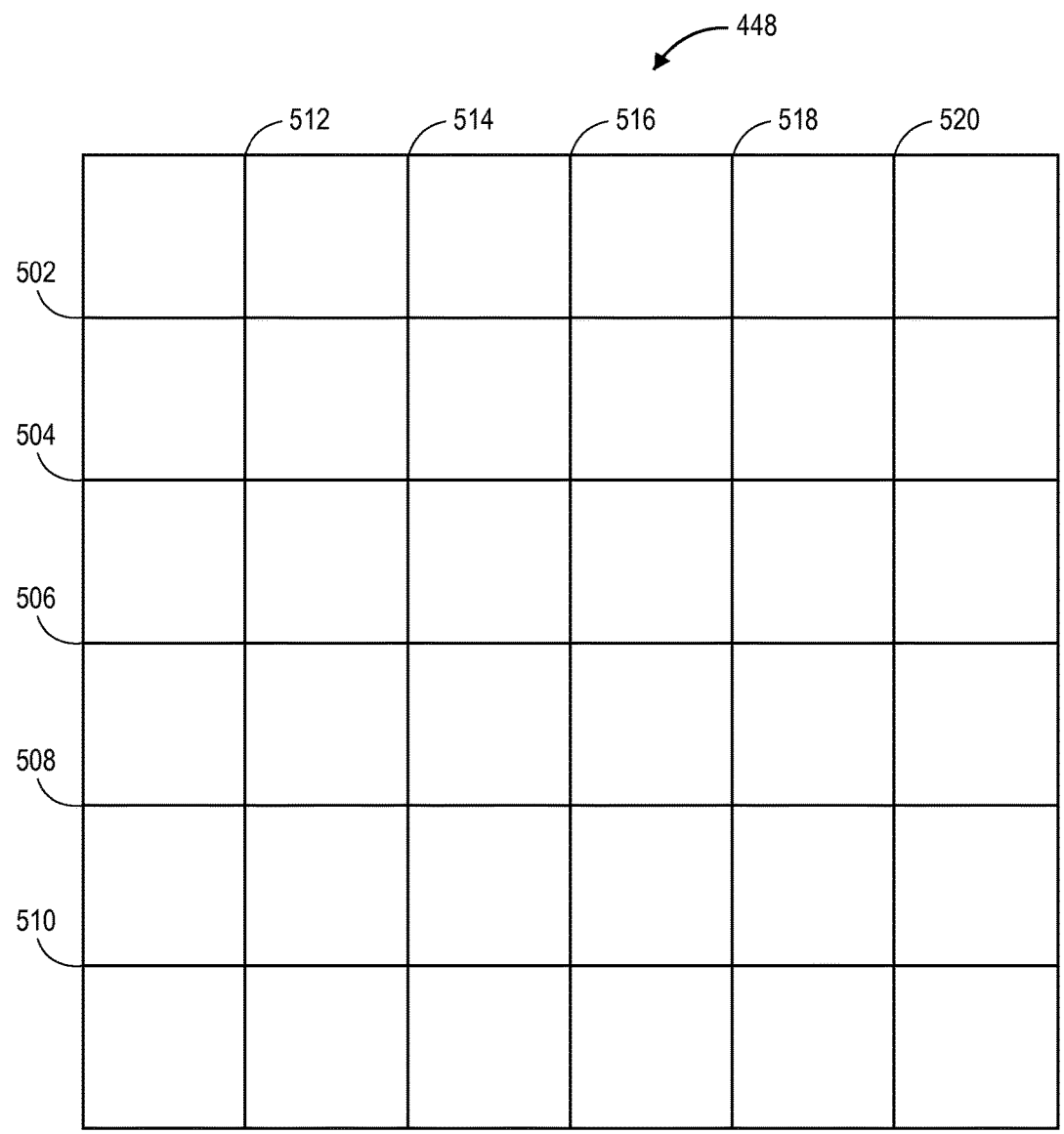
FIG. 5A is an example of a calibration plate with reference markings according to one or more embodiments.

Turning now to FIG. 5A, an example of a calibration plate 448 is provided. In this particular example, the calibration plate 448 is a plate that contains markings from which the precise position of laser spots can be determined. These markings are commonly referred to as reference markings. In the calibration plate shown in FIG. 5A, the reference markings are presented as a grid having horizontal lines 502-510, and vertical grid lines 512-520. These reference markings may be printed onto the plate, or alternatively they may be engraved into the calibration plate using laser engraving or some other engraving technique.

In general, the calibration plate may be formed of a material that is partially reflective. In particular, the calibration plate may be formed of a material which clearly shows calibration reference markings, such as grid lines 502-520, while at the same time not being so reflective that laser light completely floods a photographic image taken by the image acquisition assembly 436. In some embodiments, the calibration plate may be a black anodized aluminum plate. For example, the aluminum plate may be a white/grey painted Dibond plate, such as an aluminum/plastic/aluminum sandwich panel which is common in the printing industry. In still other embodiments, in addition to grid markings, coordinates may be assigned to one or more of the grid lines 502-520. These coordinates may assist in later identifying markings captured by the image acquisition assembly during the calibration process. In some embodiments, the coordinates may be provided by, for example, adding a small bar code which provides actual coordinates for each reference markings. Other types of markings may also be used as location identification markers. In the example shown in FIG. 5A, a barcode may be added next to each intersection of a horizontal grid line such as horizontal grid line 502, and a vertical grid line such as vertical grid line 512. In order to ensure that the calibration plate provides accurate information during the calibration process, the reference plate itself may be calibrated to ensure that the actual positions of the reference markings are known.

Figure 5B:
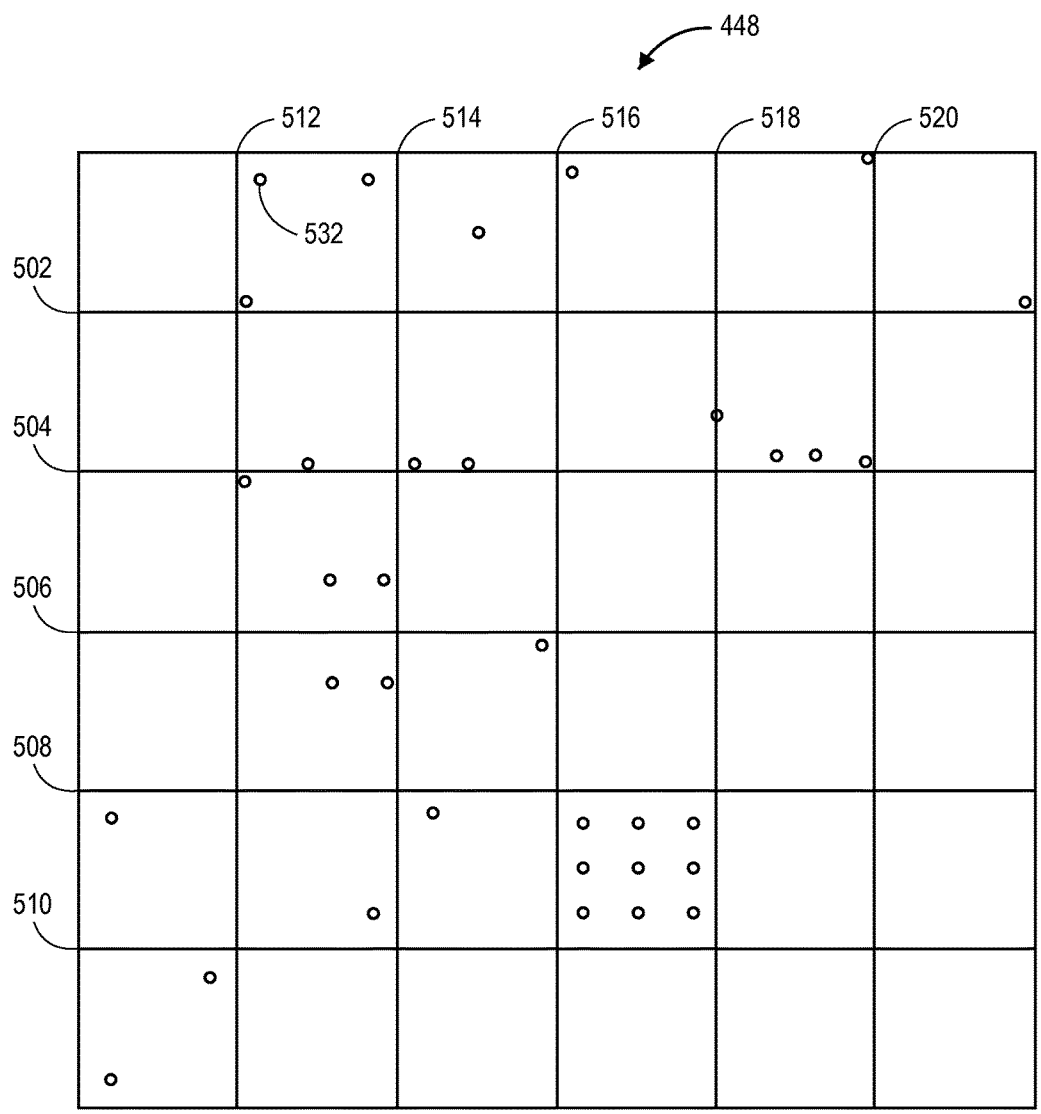
FIG. 5B is an example of a calibration plate with laser spots added by the laser scanner.

Turning now to FIG. 5B, an example of a calibration plate 448 with a plurality of laser spots 532 is shown. (Only one of the laser spots 532 is called out with a reference. It should be appreciated, however, that the remaining spots shown on the calibration plate 448 are also laser spots. The laser spots are created by a laser beam emitted by the laser source, and deflected and/or directed to the calibration plate 448 by the laser scanner. In each instance, the laser scanner is directed by the control computer 434 to direct its being to a known position. In accordance with one or more embodiments, the image acquisition assembly 436 is also controlled by the control computer 434 so that the field of view of the camera is directed to the location of each laser spot, so that an image may be acquired of the spot as well as its surrounding reference markings. In some embodiments, the camera may be moved in conjunction with the laser scanner, so that laser spots are captured as they are formed on the surface of the calibration plate. Alternatively, each of the laser spots may be formed on the surface of the calibration plate first, and then the image acquisition assembly 536 may be positioned to capture the laser spots at a later time. In either case, once the images of all of the positions of the laser spots and there proximate reference markings have been acquired, the precise location of the laser spots are determined from their relative position to the reference markings, which as discussed above, have known positions which have been previously calibrated to ensure their accuracy. It should be noted that since location of the laser spots are determined from their relative position to the reference markings, it is not required to know the exact location from which the images were taken by the image acquisition assembly 536. Further, the laser spots do not need to be made or located on the reference markings themselves, but rather their location is determined by their position relative to the reference markings, such as a distance and direction of the laser spot relative to the reference markings.

Because the laser scanner coordinate for each laser spot has been recorded, the laser scanner coordinate can be compared to the actual coordinates provided by the reference markings of the calibration plate to determine whether the laser scanner the is hitting the exact location called for by the inputted coordinate.

Figure 5C:
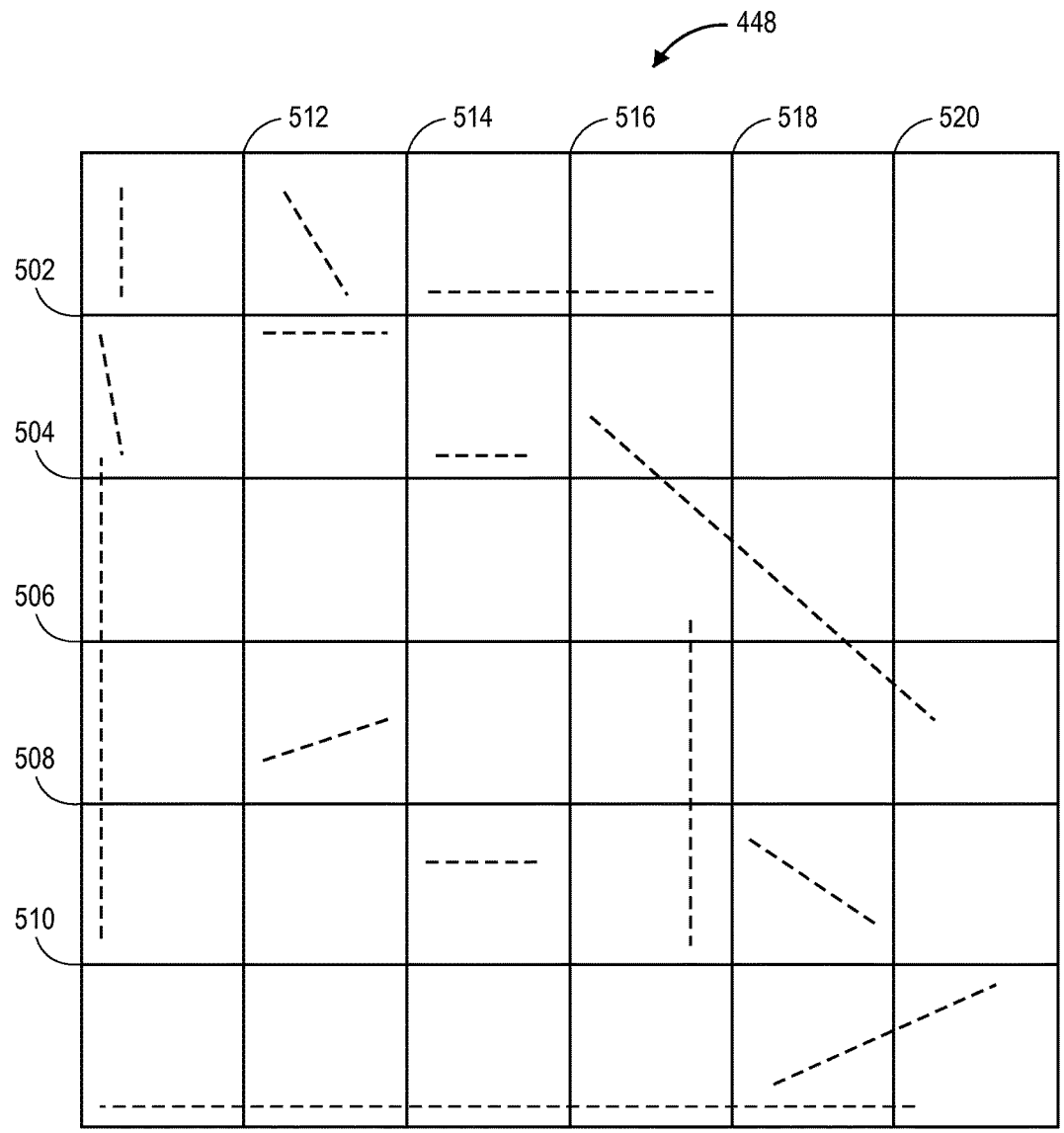
FIG. 5C is an example of a calibration plate with laser scan lines created by the laser scanner.
Figure 5D:
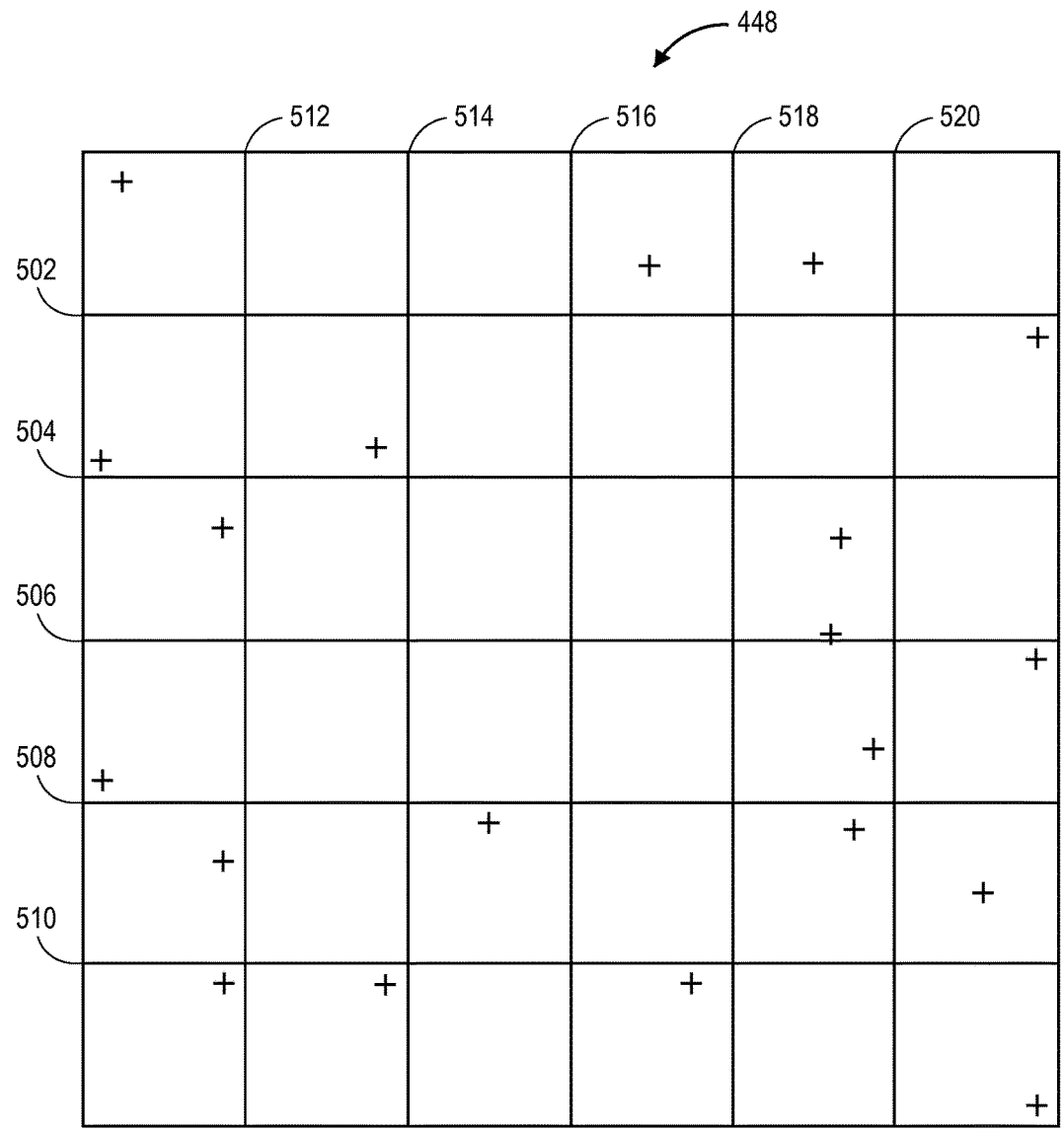
FIG. 5D is another example of laser marking which may be made by the scanner on the calibration plate.

FIG. 5C provides an illustration of an alternative embodiment for markings made by the laser scanner on the calibration plate 448. Here, rather than creating laser spots on the reference plate 448, lines are scanned into the reference plate instead. The actual location of these lines can also be put deduced by determining their position relative to the vertical and horizontal grid lines engraved in the calibration plate 448. Similarly, FIG. 5D provides an illustration where the laser markings are crosses.

Figure 6:
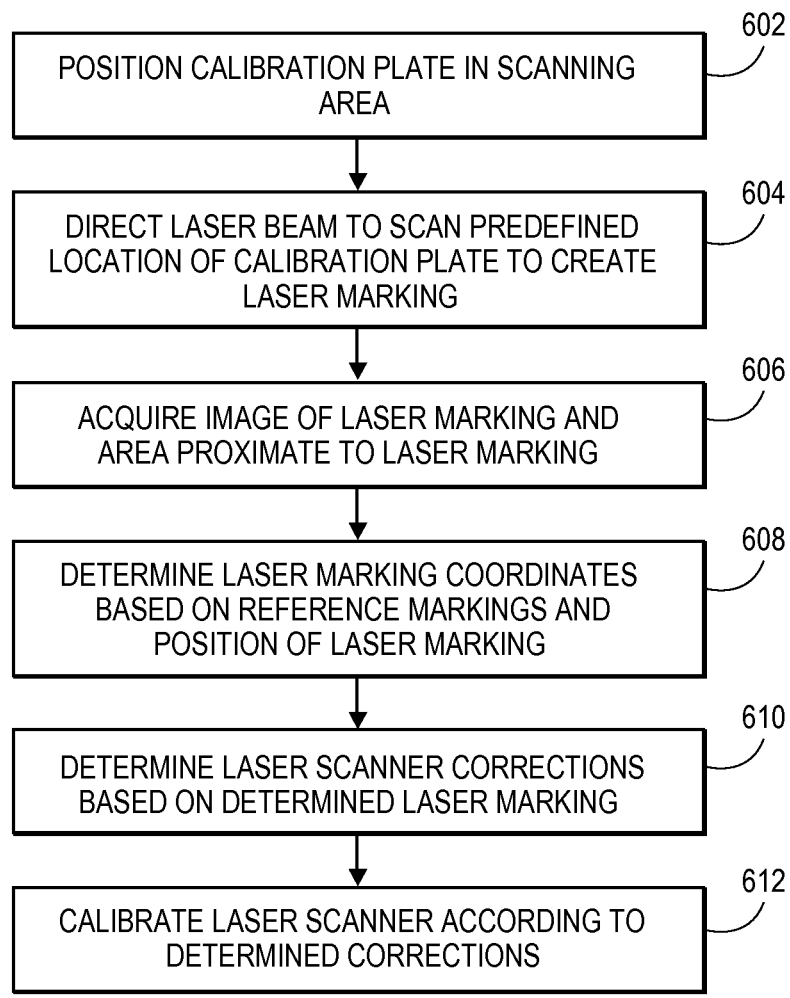
FIG. 6 is a flowchart which illustrates one example of a process by which a laser scanning system may be calibrated.

Using the calibration system described above, a laser scanner may be calibrated in a precise, inexpensive, and relatively simple fashion. FIG. 6 is a flowchart which illustrates one example of a process by which a laser scanning system may be calibrated. The process begins at block 602, where the calibration plate 448 is positioned in the laser scanning area. As discussed above, in embodiments in which the laser scanner is part of an additive manufacturing device, the calibration plate 448 may be placed proximate to the powder and/or resin used in constructing a 3-D device. In some embodiments, the calibration plate 448 may be manually positioned in the appropriate location using, for example, brackets and slots which ensure that it is positioned correctly.

Alternatively, the additive manufacturing apparatus may be designed so that the calibration plate may be automatically moved into the appropriate location during a calibration process. Once the calibration plate 448 is positioned correctly, the process moves to block 604. There, a laser beam is directed to scan a predefined location of the calibration plate in order to create a laser marking. As discussed above in connection with FIGS. 5B-5D, the laser marking may take various forms. In some embodiments, the laser marking may be simply a laser spot. Alternatively, and as shown in FIGS. 5C-5D, the laser markings may be more elaborate.

Once the laser markings have been created by the beam, the process then moves to block 606. There, an image of the laser marking and reference markings in the vicinity of the laser markings are captured by the image acquisition device 536. As discussed above, in some embodiments, the image may be captured using a digital camera mounted on a motorized tilt-pan rig or some other mount apparatus. Moreover, the movement of the digital camera may be concurrently controlled by the control computer 534 to follow the movement of the laser scanner. It should be appreciated, that in some embodiments, the camera may have sufficient resolution that it can be positioned at a wide enough angle to capture the entire reference plate. If the resolution is sufficient to show each laser marking (e.g., laser spot) across several pixels, a single image may be used to determine the actual position of the laser marking coordinates.

Next, the process moves to block 608, where the computer control system 534 determines the laser marking coordinates based on the referenced markings and the position of the laser markings. As noted above, in some embodiments, this determination may be made by comparing the position of the laser markings relative to the locations of known reference markings on the calibration plate 448. In some embodiments, the comparison may yield a coordinate table which provides inputted scanner positions and measured laser marking positions to show their differences. An example of a portion of such a table 800 is provided in FIG. 8. Using this or a similar type of table and/or other data set, corrections may be determined for the calibration of the laser scanning system. In some embodiments, these corrections may be stored in a scanner calibration table which is specific to the laser scanning device undergoing the calibration process. Once the corrections have been determined, the process moves to block 612, where the laser scanner is calibrated according the determined corrections.

Figure 7:
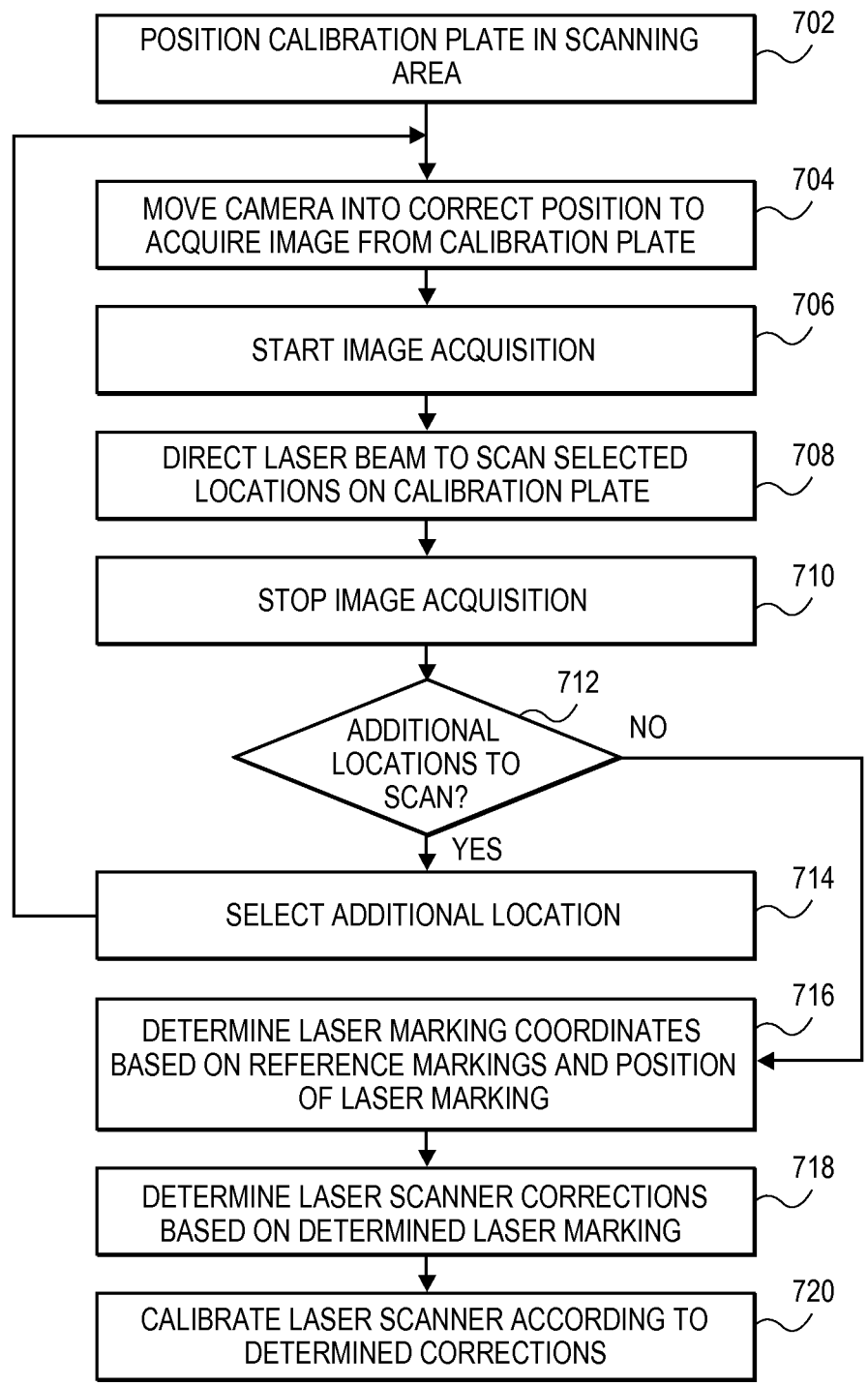
FIG. 7 is another flowchart illustrating another example of a process by which a laser scanning system may be calibrated.

FIG. 7 is another flowchart illustrating another example of a process by which a laser scanning system may be calibrated. The process beings at block 702, where the calibration plate 448 is positioned in the scanning area. Next the process moves to block 704, where the laser beam scans a selected location on the calibration plate. As discussed above, the scan may be one which creates laser spot, or it make create some other type of laser marking such as a cross or line.

Next, the process moves to decision block 706. If the image acquisition assembly 534 (e.g., the digital camera) is positioned to capture an image of the laser marking made on the calibration plate, the process moves to block 710. However, if it is determined that the image acquisition assembly is not positioned to capture the image, the process instead moves to block 708, where the image acquisition assembly is maneuvered into a position where it is able to acquire a suitable image of the laser marking.

Next, the process moves to block 710, where an image of the targeted laser marking is acquired by the image acquisition assembly and stored in a memory. Next the process moves to decision block 712, where it is determined whether there are additional locations on the calibration plate which need to be scanned by the laser scanner. If so, the process moves to block 714, where the next location is selected and the process returns to block 704 so that the additional scanning and image acquisition can take place, ultimately returning to decision block 712. If, however, at decision block 712 it is determined that there are no additional location on the calibration plate which require scanning, the process moves to block 716. There, the specific location of each of the laser markings is determined relative to the reference markings on the calibration plate 448. Next, the process moves to block 718, where the appropriate laser scanner corrections are determined based on the location of the laser markings as compared to the intended locations of each scan. Thus, for each laser marking that is in an actual location that does not match the location selected to receive the scan, a correction is determined to account for that discrepancy. Once the corrections have been determined, the process then moves to block 720, where the laser scanning device is calibrated according to the determined corrections.

In the process described above in connection with FIG. 7, the image acquisition assembly is provided on a movable mount so that it can be positioned to acquire images from specific areas on the calibration plate. In some embodiments, the movable mount may not be necessary, and instead a single image of the entire calibration plate may be acquired, and used to determine the specific location of laser markings relative to the reference markings on the calibration plate 448. In this alternate technique, the shutter time of the image acquisition device (e.g., digital camera) is set for a long enough time period so that multiple laser scans can take place and multiple images acquired in a single acquired image. Thus, in this alternative process, the image acquisition of the entire calibration plate 448 begins, scanning takes place across each of the locations on the plate to be scanned, and then the image acquisition ends.

Figure 9:
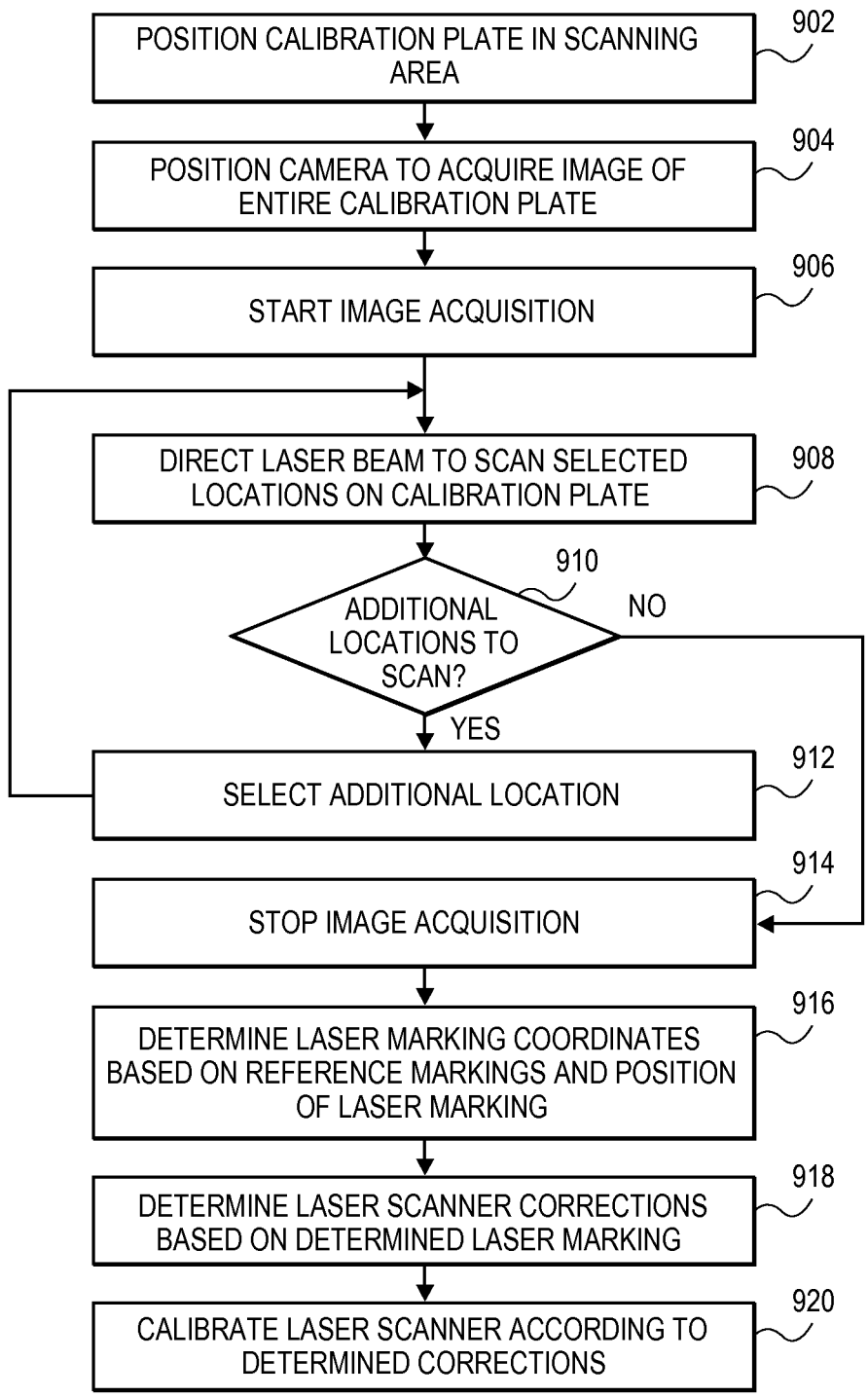
FIG. 9 is a flowchart illustrating an alternative process by which a laser scanning system may be calibrated.

FIG. 9 is a flowchart which provides an illustration of this alternative process. The process begins at block 902, where the calibration plate is positioned within the scanning area of the additive manufacturing device. The process then moves to block 904, where the image acquisition assembly, typically a digital camera, is positioned to acquire an image of the entire calibration plate 448. In some embodiments, the digital camera may be positioned directly above the plate. Alternatively, the digital camera may be positioned at an angle, and not directly above the plate.

In this embodiment, the shutter speed may be set such that there is a significant exposure time when image acquisition begins. For example, the shutter speed (also known as exposure time) of the digital camera may be set to 30 seconds or more. During this time, the laser scanner may be directed to many different locations on the calibration plate. Accordingly, at block 906 the image acquisition process begins, for example with the shutter opening to allow for the acquisition of an image of the calibration plate 448. The process then moves to block 908 where the computer control system directs the laser beam to scan selected a location (or locations) on the calibration plate 448. The process next moves to decision block 910. There, the system checks whether there are additional locations to scan on the calibration plate. If so, the process moves to block 912 where the additional location is selected. At that point, the process returns to block 908 where the laser beam is directed to the selected additional location.

If at decision block 910 no additional locations are identified, the process jumps to block 914 and the image acquisition process stops. Typically, the process stops by closing the shutter on the camera device. At this point, a single image of the entire calibration plate has been captured, including each of the markings created by the laser scans as well as the reference markings on the calibration plate 448. With the captured image, the process then moves to block 916, where the system determines the laser marking coordinates based on the reference markings and the position of the laser marking. Using the determined laser marking coordinates, laser scanner corrections are then determined at block 918. Once the laser scanner corrections have been determined, the process then moves to block 920 where the laser scanner on the device is calibrated according to the determined corrections.

Figure 10:
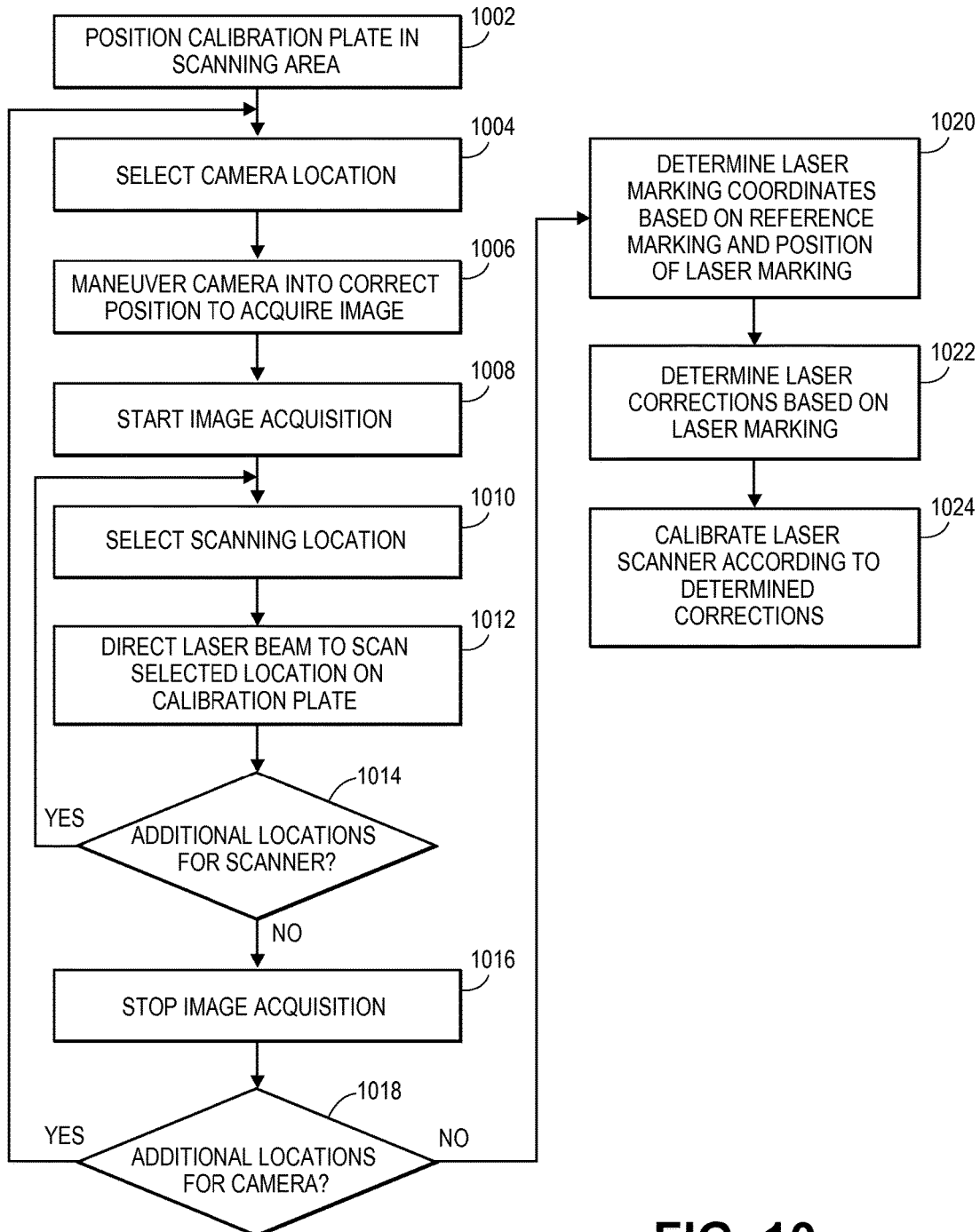
FIG. 10 is a flowchart illustrating yet another alternative process by which a laser scanning system may be calibrated.

In some embodiments, a combination of the approaches provided in FIG. 7 and FIG. 9 may be implemented. In this combination of approaches, the shutter speed may be slowed as explained in FIG. 9 to allow the camera to acquire an image of multiple laser scans during a single exposure. However, the camera may also be positioned such that it does not take an image of the entire calibration plate 448, but instead is moved after each exposure to a different area of the plate, where it can acquire another image of multiple laser scans during the next exposure. FIG. 10 provides an illustration of this combination process.

The process begins at block 1002, where the calibration plate is positioned in the scanning area. Next, the process moves to block 1004, where a camera location is selected. The camera is then maneuvered into the correct position at block 1006, where it can then acquire an image from the calibration plate. The process next moves to block 1008 where the image acquisition process begins. As explained above in connection with the FIG. 9, the shutter speed may set be set to a very long time to allow for multiple laser scans to take place while the photograph is being shot.

Process next moves to block 1010. There, a scanning location on the calibration plate is selected. Next, the process moves to block 1012 where the laser beam is directed to the selected location on the calibration plate by the laser scanner. Once the scan has been made, the process moves to decision block 1014, where it is determined whether there are additional locations for scanning during the current camera shutter. If so, the process returns to block 1010, and the additional scanning location is selected and the laser beam is directed to that location at block 1012.

If at decision block 1014 there are no additional locations for the scanner during the current exposure, no more additional scans take place in the current image acquisition process is stopped at block 1016. Next, the process moves to decision block 1018 to determine whether there are additional locations on the calibration plate for which images need to be acquired by the image acquisition assembly. If so, the process returns to block 1004 where the new camera location is selected, and then the process repeats itself. If no additional locations are needed, the process moves them to block 1020 where the laser marking coordinates are determined based on the reference markings and the position of laser markings in the acquired images. The process then moves to block 1022 where the laser corrections are determined based on the position of the laser markings determined in the previous step. Once the laser corrections are determined, the process then moves to block 1024 where the laser scanner is calibrated according to the determined corrections.

The systems and methods disclosed herein provide several advantages over existing calibration techniques. In particular, the image acquisition assembly can be constructed using inexpensive, off-the-shelf, standard components such as digital cameras and a motion tilt-pan rigs. The use of a calibration plate allows for a simple mechanical design which can be used across a variety of different machines. Moreover, to the extent that a calibration plate must be specific to a size or type of machine, the calibration plate may be easily manufactured and reference markings can be placed on the plate using a simple printing or laser engraving process. Still further, the use of the calibration plate obviates the need to use consumable resources such as papers, single-use substrates and the like.

In some embodiments, the systems and methods as described above, including processes described with respect to FIGS. 6, 7, 9, and 10, may be configured to be performed over a network, as described with respect to FIG. 1. For example, images captured by the image acquisition device, such as an image of the laser marking and reference markings in the vicinity of the laser markings, may be sent over a network (e.g., the Internet) to a computer, such as one or more of the computer 102a-d of FIG. 1, that analyzes the image. Accordingly, the capturing of the images (e.g., blocks 604 and 606; blocks 704-714; blocks 906-914; and/or blocks 1004-1018) may be driven by a first computer, such as a computer 102(a) from FIG. 2, the computer 305 from FIG. 3, or the control computer 434 from FIG. 4. The image may then be sent by the first computer over the network 105 to a second computer that drives analysis of the image (e.g., blocks 608-610; blocks 716-718; blocks 916-918; and/or blocks 1020-1022), such as one or more of the computer 102a-d. The second computer that drives analysis may then determine laser corrections that need to be made to the laser scanner and send data (e.g., a calibration file) indicative of the needed laser corrections to the first computer over the network 105. The first computer may then drive calibration of the laser scanner (e.g., block 612, 720, 920, and/or 1024) according to the received data.

Various embodiments disclosed herein provide for the use of a computer control system. A skilled artisan will readily appreciate that these embodiments may be implemented using numerous different types of computing devices, including both general purpose and/or special purpose computing system environments or configurations. Examples of well-known computing systems, environments, and/or configurations that may be suitable for use in connection with the embodiments set forth above may include, but are not limited to, personal computers, server computers, hand-held or laptop devices, multiprocessor systems, microprocessor-based systems, programmable consumer electronics, network PCs, minicomputers, mainframe computers, distributed computing environments that include any of the above systems or devices, and the like. These devices may include stored instructions, which, when executed by a microprocessor in the computing device, cause the computer device to perform specified actions to carry out the instructions. As used herein, instructions refer to computer-implemented steps for processing information in the system. Instructions can be implemented in software, firmware or hardware and include any type of programmed step undertaken by components of the system.

A microprocessor may be any conventional general purpose single- or multi-chip microprocessor such as a Pentium® processor, a Pentium® Pro processor, a 8051 processor, a MIPS® processor, a Power PC® processor, or an Alpha® processor. In addition, the microprocessor may be any conventional special purpose microprocessor such as a digital signal processor or a graphics processor. The microprocessor typically has conventional address lines, conventional data lines, and one or more conventional control lines.

Aspects and embodiments of the inventions disclosed herein may be implemented as a method, apparatus or article of manufacture using standard programming or engineering techniques to produce software, firmware, hardware, or any combination thereof. The term "article of manufacture" as used herein refers to code or logic implemented in hardware or non-transitory computer readable media such as optical storage devices, and volatile or non-volatile memory devices or transitory computer readable media such as signals, carrier waves, etc. Such hardware may include, but is not limited to, field programmable gate arrays (FPGAs), application-specific integrated circuits (ASICs), complex programmable logic devices (CPLDs), programmable logic arrays (PLAs), microprocessors, or other similar processing devices.

What is claimed is:

1. An additive manufacturing apparatus arranged for calibrating a laser scanner, the additive manufacturing apparatus comprising a building area where a 3D object is built, the additive manufacturing apparatus comprising:
   a calibration plate in the additive manufacturing apparatus comprising reference markings, the calibration plate being positioned in the building area or the calibration plate being positioned between the building area and the laser scanner,
   the laser scanner, the laser scanner being configured to send a laser beam to a predefined location on the calibration plate which forms a laser marking on the calibration plate, wherein the predefined location is selected from any point on the calibration plate;
   an image acquisition assembly comprising an image acquisition device, the image acquisition device configured to photograph at least a portion of the calibration plate associated with the predefined location on the calibration plate; and
   a computer control system comprising one or more computers having a memory and a processor, the computer control system configured to:
      cause the laser scanner to direct the laser beam to a plurality of predefined locations on the calibration plate thereby creating one or more laser markings at any point on the calibration plate, wherein at least one of the one or more laser markings is located in a different position than the reference markings;
      receive an image of at least a portion of the calibration plate including at least the at least one of the one or more laser markings;
      determine laser marking coordinates for each predefined location based on the position of the formed laser marking relative to the reference markings on the calibration plate; and
      determine scanner corrections based on the determined laser marking coordinates.

2. The additive manufacturing apparatus of claim 1, wherein the reference markings comprise a plurality of gridlines visible on the calibration plate.

3. The additive manufacturing apparatus of claim 2, wherein the reference markings further include location identification markers indicative of a coordinate position associated with specific locations on the gridlines.

4. The additive manufacturing apparatus of claim 3, wherein the location identification markers are barcode information.

5. The additive manufacturing apparatus of claim 1, wherein the image acquisition assembly further comprises a movable mount, and wherein the computer control system is further configured to position the image acquisition assembly, using the movable mount, in a location proximate to the plurality of predefined locations on the calibration plate and acquire an image of each of the plurality of predefined locations.

6. The additive manufacturing apparatus of claim 5, wherein the image acquisition assembly includes a digital camera, and wherein the movable mount comprises a motorized tilt-pan rig.

7. The additive manufacturing apparatus of claim 1, wherein the laser marking comprises at least one of a laser spot, crossing lines, and a laser line.

8. The additive manufacturing apparatus of claim 1, wherein the additive manufacturing apparatus comprises at least one of a selective laser sintering apparatus and a stereolithography device.

9. The additive manufacturing apparatus of claim 1, wherein at least one of powder resin and liquid resin remains in the building area after the calibration plate is positioned in the device and also during calibration of the device.

10. The additive manufacturing apparatus of claim 1, wherein the calibration plate is positioned in the building area at a same location as a powder surface or liquid resin.

11. The additive manufacturing apparatus of claim 1, wherein the laser scanner comprises a laser source.

12. A method of calibrating a laser scanner in an additive manufacturing apparatus, the additive manufacturing apparatus comprising a building area where a 3D object is built, the method comprising:
   inserting a calibration plate into the additive manufacturing apparatus comprising at least one reference marking, wherein:
      the calibration plate being positioned in the building area, or
      the calibration plate being positioned between the building area and the laser scanner;
   forming one or more laser markings at any location on the calibration plate by directing a laser beam from the laser scanner at a plurality of predefined locations, wherein at least one of the one or more laser markings is located in a different position from the at least one reference marking;
   acquiring, using an image acquisition assembly, an image of the formed one or more laser markings;
   determining laser marking coordinates for each predefined location based on the position of the formed one or more laser markings relative to at least one of the at least one reference marking on the calibration plate;
   determining scanner corrections based on the determined laser marking coordinates; and
   sending the scanner corrections to at least one computer to direct calibration of the laser scanner.

13. The method of claim 12, wherein the at least one reference marking comprises a plurality of gridlines visible on the calibration plate.

14. The method of claim 13, wherein the plurality of gridlines are printed on the calibration plate.

15. The method of claim 13, wherein coordinates indicative of the specific locations of the plurality of gridlines are stored in a computer memory.

16. The method of claim 13, wherein the at least one reference markings further includes location information markers indicative of a coordinate position associated with specific locations on the gridlines.

17. The method of claim 12, wherein each of the one or more laser marking comprises at least one of a laser spot, crossing lines, and a laser line.

18. The method of claim 12, further comprising positioning the image acquisition assembly in a location proximate to the plurality of predefined locations on the calibration plate, wherein the image acquisition assembly comprises a digital camera and a moveable mount having a motorized tilt-pan rig.

19. The method of claim 12, wherein the additive manufacturing environment comprises at least one of a selective laser sintering apparatus and a stereolithography device.

20. The method of claim 12, wherein at least one of powder resin and liquid resin remains in the building area after the calibration plate is positioned in the device and also during calibration of the device.

21. A method of calibrating a laser scanner in an additive manufacturing environment, the additive manufacturing apparatus comprising a building area where a 3D object is built, the method comprising:
   receiving an image taken by an image acquisition assembly, the image comprising one or more laser markings formed by directing a laser beam from the laser scanner at a plurality of predefined locations on a calibration plate inserted into the additive manufacturing apparatus comprising at least one reference marking, wherein at least one of the one or more laser markings is located in a different position than the at least one reference marking on the calibration plate,
   the calibration plate being positioned in the building area, or the calibration plate being positioned between the building area and the laser scanner,
   determining laser marking coordinates for each predefined location based on the position of the formed one or more laser markings relative to the at least one reference marking on the calibration plate;
   determining scanner corrections based on the determined laser marking coordinates and independent of a position of the image acquisition assembly; and
   sending the scanner corrections to at least one computer to direct calibration of the laser scanner.

22. The method of claim 21, wherein the image comprises at least one of an image of multiple laser scans during a single exposure and a plurality of exposures at different areas of the calibration plate.

* * * * *